US009391121B2

(12) United States Patent
Lee et al.

(10) Patent No.: US 9,391,121 B2
(45) Date of Patent: Jul. 12, 2016

(54) ORGANIC LIGHT-EMITTING DIODE (OLED) DISPLAY

(71) Applicant: Samsung Display Co., Ltd., Yongin, Gyeonggi-Do (KR)

(72) Inventors: Bum Suk Lee, Hwaseong-si (KR); Ha Jin Song, Hwaseong-si (KR); Ji Hwan Yoon, Yongin-si (KR); Ji Young Kwon, Uijeongbu-si (KR); Byeong Wook Yoo, Hwaseong-si (KR); Ji Myoung Ye, Busan (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 40 days.

(21) Appl. No.: 14/316,541

(22) Filed: Jun. 26, 2014

(65) Prior Publication Data

US 2015/0090972 A1   Apr. 2, 2015

(30) Foreign Application Priority Data

Sep. 30, 2013   (KR) .................. 10-2013-0116666

(51) Int. Cl.
*H01L 51/50*   (2006.01)
*H01L 27/32*   (2006.01)
*H01L 51/52*   (2006.01)

(52) U.S. Cl.
CPC ........ *H01L 27/3211* (2013.01); *H01L 51/5012* (2013.01); *H01L 51/5265* (2013.01); *H01L 2251/558* (2013.01)

(58) Field of Classification Search
CPC ................................... H01L 51/5088
USPC ............................................. 257/40
See application file for complete search history.

(56) References Cited

U.S. PATENT DOCUMENTS

2009/0108741 A1\* 4/2009 Yokoyama .......... H01L 27/3211
                                                          313/504
2015/0270505 A1\* 9/2015 Seo .................... H01L 51/5028
                                                          257/40

FOREIGN PATENT DOCUMENTS

| KR | 10-0650046 (B1) | 11/2006 |
| KR | 10-2007-0081965 (A) | 8/2007 |
| KR | 10-1137392 (B1) | 4/2012 |

\* cited by examiner

*Primary Examiner* — Edward Wojciechowicz
(74) *Attorney, Agent, or Firm* — Knobbe, Martens, Olson & Bear, LLP

(57) ABSTRACT

An organic light-emitting diode (OLED) display is disclosed. In one aspect, the OLED display includes red, green, and blue pixels. Each pixel includes a pixel electrode, a hole auxiliary layer formed over the pixel electrode, and an organic emission layer formed over the hole auxiliary layer. Each pixel also includes an electron auxiliary layer formed over the organic emission layer, and a common electrode formed over the electron auxiliary layer. Each of the red and green pixels further includes a host layer formed between the hole auxiliary layer and the organic emission layer and a resonance layer formed between the host layer and the organic emission layer.

20 Claims, 7 Drawing Sheets

ORGANIC LIGHT-EMITTING DIODE (OLED) DISPLAY

CROSS-REFERENCE TO RELATED APPLICATIONS

This application claims priority to and the benefit of Korean Patent Application No. 10-2013-0116666 filed in the Korean Intellectual Property Office on Sep. 30, 2013, the entire contents of which are incorporated herein by reference.

BACKGROUND

1. Field

The described technology generally relates to an organic light-emitting diode (OLED) display having a bottom blue common layer (BBCL) structure.

2. Description of the Related Technology

Organic light-emitting diode (OLED) displays include two electrodes and an organic emission layer provided therebetween. Light is emitted from an OLED by injecting electrons from one electrode and holes from the other electrode. The injected electrons and holes are recombined with each other in the organic emission layer to form excitons which discharge energy to emit light.

SUMMARY OF CERTAIN INVENTIVE ASPECTS

One inventive aspect is an OLED display that can reduce the driving voltage for pixels thereof by smoothing hole injection by depositing a material as a host layer in red and green pixels, the material having an energy level that is lower than that of the material of a blue host layer.

Another aspect is an OLED display including red pixels, green pixels, and blue pixels, and each of the red pixels, each of the green pixels, and each of the blue pixels respectively include pixel electrodes, hole auxiliary layers formed on the pixel electrodes, host layers formed on the hole auxiliary layers, electron auxiliary layers formed on the host layers, and common electrode layers formed on the electron auxiliary layers. The red pixel and green pixel further include a red resonance auxiliary layer and a green resonance auxiliary layer respectively formed on the host layers thereof, and a red organic emission layer and a green organic emission layer respectively formed on the red resonance auxiliary layer and the green resonance auxiliary layer.

The OLED display further includes a red interface layer and a green interface layer respectively formed under the red resonance auxiliary layer and the green resonance auxiliary layer.

The hole auxiliary layer may include a hole injection layer formed on the pixel electrode and a hole transport layer formed on the hole injection layer, and the electron auxiliary layer may include an electron transport layer formed on the red organic emission layer and the green organic emission layer and an electron injection layer formed on the electron transport layer.

The host layer may be a red host layer made of a red organic emission material in the red pixel.

The red organic emission material may have a HOMO energy level of about −5.34 eV.

The host layer may be a green host layer made of a green organic emission material in the green pixel.

The green organic emission material may have a HOMO energy level of about −5.29 eV.

The host layer may be a blue host layer made of a blue organic emission material in the blue pixel.

The blue organic emission material may have a HOMO energy level of about −5.61 eV.

The host layer may be formed by vacuum deposition.

According to at least one embodiment, the red and green host layers, respectively formed of a material having a low HOMO energy level, are respectively provided in the locations of the blue host layers in the red and green pixels, and thus, the energy barrier for hole injection can be reduced so that the device can be driven with a low voltage, thereby improving luminance efficiency and life-span of the device.

Another aspect is an organic light-emitting diode (OLED) display, comprising: a plurality of red, green, and blue pixels, wherein each pixel comprises: a pixel electrode; a hole auxiliary layer formed over the pixel electrode; an organic emission layer formed over the hole auxiliary layer; an electron auxiliary layer formed over the organic emission layer; and a common electrode formed over the electron auxiliary layer, and wherein each of the red and green pixels further comprises: a host layer formed between the hole auxiliary layer and the organic emission layer; and a resonance auxiliary layer formed between the host layer and the organic emission layer.

In the above display, each of the red and green pixels further comprises an interface layer formed between the host layer and the resonance auxiliary layer. In the above display, the hole auxiliary layer comprises i) a hole injection layer formed over the pixel electrode and ii) a hole transport layer formed over the hole injection layer and wherein the electron auxiliary layer comprises i) an electron transport layer formed over each of the organic emission layers and ii) an electron injection layer formed over the electron transport layer. In the above display, the host layer included in the red pixel comprises a red host layer formed at least partially of a red organic emission material. In the above display, the red organic emission material has the highest occupied molecular orbital (HOMO) energy level of about −5.34 eV.

In the above display, the host layer included in the green pixel is a green host layer formed at least partially of a green organic emission material. In the above display, the green organic emission material has the highest occupied molecular orbital (HOMO) energy level of about −5.29 eV. In the above display, the organic emission layer included in the blue pixel is formed at least partially of a blue organic emission material. In the above display, the blue organic emission material has the highest occupied molecular orbital (HOMO) energy level of about −5.61 eV. In the above display, at least two of the host layer, the interface layer, the resonance auxiliary layer, or the organic emission layer are substantially aligned with each other.

In the above display, at least two of the host layer, the interface layer, the resonance auxiliary layer, or the organic emission layer have substantially the same width. In the above display, at least one of the host layer, the interface layer, the resonance auxiliary layer, or the organic emission layer is formed directly above the pixel electrode. In the above display, the thickness of the resonance layers included in each of the red and green pixels is selected such that light having a wavelength corresponding to the color of the pixel resonates between the pixel electrode and the common electrode.

Another aspect is an organic light-emitting diode (OLED) display, comprising: a substrate; a hole auxiliary layer formed over the substrate; an electron auxiliary layer formed over the hole auxiliary layer; and a plurality of red, green, and blue pixels formed over the substrate, wherein each pixel comprises an organic emission layer formed between the hole auxiliary layer and the electron auxiliary layer, and wherein each of the red and green pixels comprises: a host layer formed between the hole auxiliary layer and the organic emission layer; and a resonance auxiliary layer formed between the host layer and organic emission layer. The OLED display of claim 14, wherein each of the red and green pixels further comprises an interface layer formed between the host layer and the resonance auxiliary layer.

The above display further comprises a common electrode formed over the electron auxiliary layer, wherein each pixel further comprises a pixel electrode formed between the substrate and the hole auxiliary layer. In the above display, the hole auxiliary layer comprises i) a hole injection layer formed over the pixel electrode and ii) a hole transport layer formed over the hole injection layer and wherein the electron auxiliary layer comprises i) an electron transport layer formed over each of the organic emission layers and ii) an electron injection layer formed over the electron transport layer.

In the above display, at least two of the host layer, the interface layer, the resonance auxiliary layer, or the organic emission layer are substantially aligned with each other. In the above display, at least one of the host layer, the interface layer, the resonance auxiliary layer, or the organic emission layer is formed directly above the pixel electrode. In the above display, the thickness of the resonance layers included in each of the red and green pixels is selected such that light having a wavelength corresponding to the color of the pixel resonates between the pixel electrode and the common electrode.

DETAILED DESCRIPTION OF CERTAIN INVENTIVE EMBODIMENTS

Figure 1:
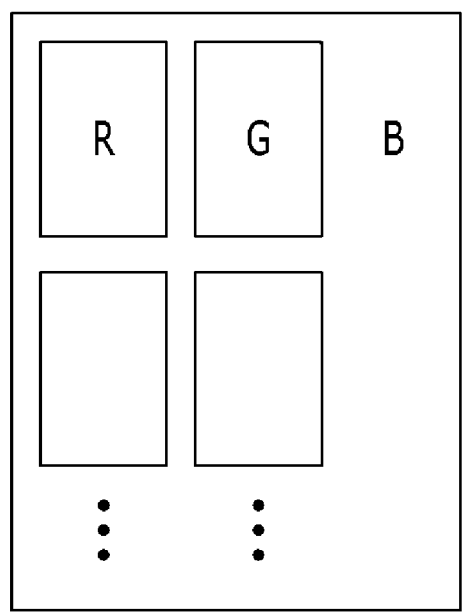
FIG. 1 is a top plan view of the pixel arrangement of an OLED display according to an exemplary embodiment.

In order to implement colors in an OLED display, red, green, and blue organic emission layers can be formed using a laser induced thermal imaging method.

Laser induced thermal imaging typically includes patterning a laser beam using a mask pattern and irradiating the patterned laser beam onto a donor film. The donor film includes a base film and a transfer layer which can be transferred to the OLED display when irradiated with the laser beam. The irradiated transfer layer is partially expanded such that an emission layer is formed in the OLED display. Accordingly, emission layers can be finely patterned for each pixel of the OLED display. Laser induced thermal imaging has the advantage of being a dry process.

One type of OLED display is a bottom blue common layer (BBCL) display. In the typical BBCL display, a blue host layer is formed on a hole auxiliary layer for each pixel of the display by applying a high performance scanning (HPS) process. Each red and green pixel in the display includes the blue host layer and a red or green host layer formed on the blue host layer.

In the above-described structure, the highest occupied molecular orbital (HOMO) energy level of the blue host layer is significantly different from those of the red and green host layers. Accordingly, hole injection from the hole auxiliary layer to each of the red and green host layers lacks efficiency. Thus, the movement of charge carriers requires more energy in the red and green pixels and a driving voltage applied to the red and green pixels must be increased to provide the extra energy.

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

It shall be noted that the drawings are schematic and do not depict exact dimensions. The relative proportions and ratios of elements in the drawings may be exaggerated or diminished in size for the sake of clarity and convenience in the drawings, and such proportions are only illustrative and not limiting in any way. Like reference numerals are used for like structures, elements, or parts shown in two or more drawings to show similar characteristics. When one element is said to be "over" or "on" another element, the one element may be directly over the other element or another element may be interposed therebetween.

Only certain exemplary embodiments are illustrated in the drawings. As a result, various modifications of the drawings can be made without departing from the described technology. Accordingly, the embodiments described herein are not limited to the specific forms illustrated, but may include other forms that are modified through, for example, manufacturing.

Hereinafter, an organic light-emitting diode (OLED) display according to an exemplary embodiment will be described in detail with reference to FIG. 1 to FIG. 3.

FIG. 1 is a schematic top plan view of a pixel arrangement of an OLED display according to an exemplary embodiment.

As shown in FIG. 1, the OLED display includes red, green, and blue pixels R, G, and B that respectively emit red, green, and blue light. Red, green, and blue may be examples of primary colors for displaying full colors and the red, green, and blue pixels R, G, and B may be primary pixels for displaying full colors. In the present exemplary embodiment, the three pixels form one group and the group is iteratively arranged along rows and columns.

In further detail, in the arrangement of the red, green, and blue pixels R, G, and B a plurality of each color of pixel are alternately arranged in a row. Each of the red, green, and blue pixels R, G, and B may have substantially the same size.

FIG. 1 shows a bottom blue common layer (BBCL) structure for the blue pixel B and the area surrounding the red and green pixels R and G. Thus, the blue organic emission layer is formed not only in the blue pixel B area but also in the entire area surrounding each of the red and green pixels R and G. The shape and arrangement of the pixels can be variously modified and other pixels such as a white pixel emitting white light may further be included.

Now, referring to FIG. 1 and FIG. 2, a pixel of the OLED display will be described in further detail.

Figure 2:
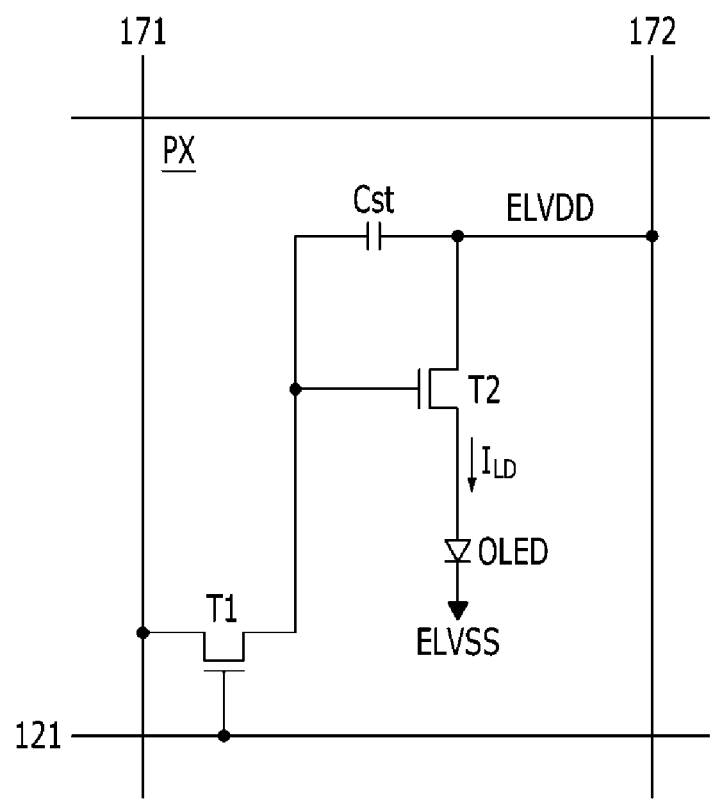
FIG. 2 is an equivalent circuit diagram of a pixel in the OLED display according to an exemplary embodiment.

FIG. 2 is an equivalent circuit diagram of a pixel in the OLED display according to an exemplary embodiment.

As shown in FIG. 2, the OLED display includes a plurality of signal lines 121, 171, and 172 and a plurality of pixels PX connected to the signal lines 121, 171, and 172 and arranged in a matrix format.

The signal lines include a plurality of scan lines 121 transmitting scan signals (or gate signals), a plurality of data lines 171 transmitting data signals, and a plurality of driving voltage lines 172 transmitting a driving voltage ELVDD. The scan lines 121 extend in a row direction substantially parallel to each other, and the data lines 171 and the driving voltage lines 172 extend in a column direction substantially parallel to each other. Each pixel PX includes a switching transistor T1, a driving transistor T2, a storage capacitor Cst, and an OLED.

The switching transistor T1 includes a control terminal, an input terminal, and an output terminal. The control terminal is connected to a scan line 121, the input terminal is connected to a data line 171, and the output terminal is connected to the driving transistor T2. The switching transistor T1 transmits a data signal applied to the data line 171 to the driving transistor T2 in response to a scan signal applied to the scan line 121.

The driving transistor T2 also includes a control terminal, an input terminal, and an output terminal. The control terminal is connected to the switching transistor T1, the input terminal is connected to a driving voltage line 172, and the output terminal is connected to the OLED. The driving transistor T2 outputs an output current $I_{LD}$ with a magnitude which varies depending on the voltage between the control and output terminals thereof.

The storage capacitor Cst is connected between the control and input terminals of the driving transistor T2. The storage capacitor Cst stores a data signal applied to the control terminal of the driving transistor T2 and maintains the data signal after the switching transistor T1 is turned off.

The OLED includes an anode connected to the output terminal of the driving transistor T2, a cathode connected to a common voltage ELVSS, and an organic emission member or organic emission layer formed between the anode and the cathode. The OLED emits light with an intensity according to the output current $I_{LD}$ of the driving transistor T2 to display an image.

The switching and driving transistors T1 and T2 may be n-channel field effect transistors (FETs) or p-channel FETs. In addition, the connection relationship of the transistors T1 and T2, the capacitor Cst, and the OLED may be changed.

Now, a cross-sectional structure of the three pixels of the OLED display will be described in detail with reference to FIG. 2, FIG. 3, and FIG. 4.

Figure 3:
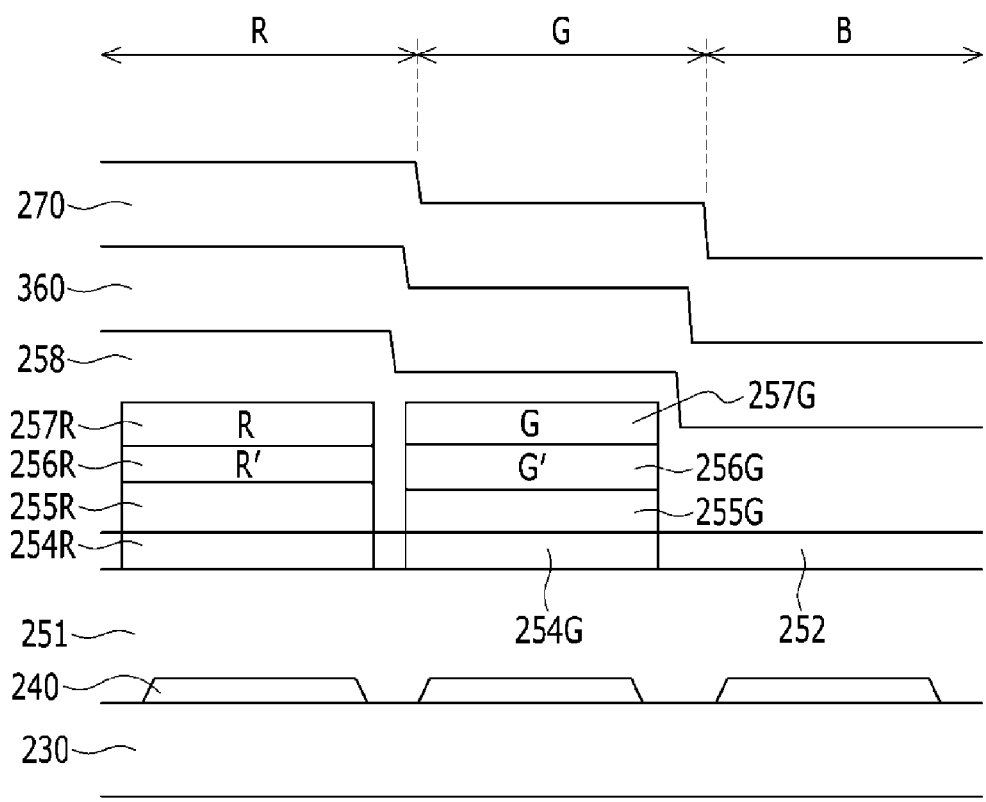
FIG. 3 is a cross-sectional view of three pixels of the OLED display according to an exemplary embodiment.

FIG. 3 is a cross-sectional view of the three pixels of the OLED display according to an exemplary embodiment. FIG. 4 shows a state in which a donor film of the OLED display is transferred to a hole transport layer of the red pixel according to an exemplary embodiment.

The OLED display according to the present embodiment includes a plurality of driving transistors (not shown) formed on an insulating TFT substrate 230 that can be made of transparent glass or plastic. The OLED display further includes a plurality of signal lines (not shown) and a plurality of switching transistors (not shown) formed on the TFT substrate 230.

A protective layer (not shown) that can be made of an inorganic or organic material is formed on the driving transistor. When the protective layer is made of an organic material, the protective layer may have a flat surface.

As shown in FIG. 3, a pixel electrode 240 is formed on protective layers of the respective pixels R, G, and B. In this case, a red pixel electrode is formed in the red pixel R, a green pixel electrode is formed in the green pixel G, and a blue pixel electrode is formed in the blue pixel B. The pixel electrode 240 may be made of a transparent conductive oxide such as indium tin oxide (ITO) or indium zinc oxide (IZO).

A reflective layer (not shown) which can reflect light generated from an organic emission layer to a front side of the OLED display may be formed between the protective layer and the pixel electrode 240. The reflective layer may be formed of a metal having high reflectivity such as silver (Ag) or aluminum (Al) or alloys thereof.

A hole auxiliary layer 251 is formed on the pixel electrode 240 in each of the red, green, and blue pixels R, G, and B and the hole auxiliary layer 251 may be formed in a single layer including a hole transport layer (HTL) or may be formed of in double layer including a hole injection layer (HIL) and the hole transport layer.

A red host layer 254R may be formed on the hole auxiliary layer 251 of the red pixel R and a green host layer 254G may be formed on the hole auxiliary layer 251 of the green pixel G. In contrast to the typical BBCL structure in which a blue host layer is formed over the entire hole auxiliary layer, the present embodiment includes red and green host layers 254R and 254G respectively corresponding to the red and green pixels. The red and green host layers 254R and 254G are formed on hole auxiliary layers of their respective pixels.

A red interface layer 255R and a green interface layer 255G are respectively formed on the red and green host layers 254R and 254G included in the red and green pixels R and G. A red resonance auxiliary layer 256R is formed on the red interface layer 255R and a green resonance auxiliary layer 256G is formed on the green interface layer 255G. In this case, the thickness of the red resonance auxiliary layer 256R may be different from the thickness of the green resonance auxiliary layer 256G. The red and green resonance auxiliary layers 256R and 256G are added to adjust the resonance distance for each color and they may be formed of the same material as the hole transport layer. Since the required driving current does not depend on the thickness of the hole transport layer, the material forming the hole transport layer may be an appropriate material for the resonance auxiliary layer in order to adjust the resonance distance.

A red organic emission layer 257R is layered on the red resonance auxiliary layer 256R of the red pixel R and a green organic emission layer 257G is layered on the green resonance auxiliary layer 256G of the green pixel G. According to some embodiments, the red and green organic emission layers 257R and 257G are formed by a laser induced thermal imaging method and the blue organic emission layer 252 is formed by a vacuum deposition method. In addition, the red and green host layers 254R and 254G may also be formed on the hole auxiliary layers 251 of the respective red and green pixels R and G by vacuum deposition. The red, green, and blue organic emission layers 257R, 257G, and 252 may be respectively formed of organic materials uniquely emitting red, green, and blue light.

The red interface layer 255R, the red resonance auxiliary layer 256R, and the red organic emission layer 257R are transfer layers 20 transferred from a donor film, and hereinafter, a transfer process will be described in detail with reference to FIG. 4. The transfer process of the green interface layer 255G, the green resonance auxiliary layer 256G, and the green organic emission layer 257G is basically the same as the transfer process of the corresponding red layers and therefore no further description thereof will be provided.

Figure 4:
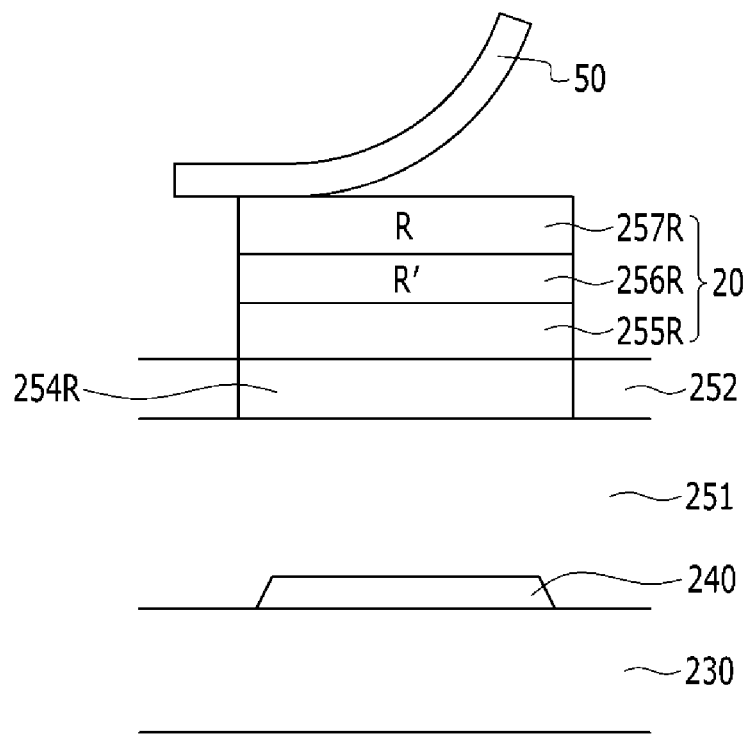
FIG. 4 shows a state in which a donor film of the OLED display is transferred to a hole transport layer of a red pixel according to an exemplary embodiment.

As shown in FIG. 4, a donor film includes the red organic emission layer 257R and is positioned over the red host layer 254R of the substrate 230 where the pixel electrode 240 is formed. The donor film has a structure in which a base film 50 and the transfer layer 20 are sequentially layered. The base film 50 is transparent to allow for light transmission to a light-to-heat conversion layer, and may be made of a material having appropriate optical characteristics and sufficient mechanical stability.

The light-to-heat conversion layer (not shown) may be formed between the base film 50 and the transfer layer 20 and the light-to-heat conversion layer absorbs light in the range of infrared light to visible light and converts a part of the absorbed light into heat. Thus, the light-to-heat conversion layer may have a suitable optical density and preferably includes a light absorbing material for light absorption.

The transfer layer 20 is separated from the base film 50 due to the heat energy transmitted from the light-to-heat conversion layer and is then transferred to the substrate 230 where the red host layer 245R is formed. The transfer layer 20 has a structure in which the red organic emission layer 257R, the red resonance auxiliary layer 256R, and the red interface layer 255R area sequentially layered.

In addition, the red interface layer 255R of the donor film is uniformly laminated to the red host layer 254R. Then, laser beams are irradiated to the donor film closely attached to the red host layer 254R to transfer the transfer layer 20 of the donor film to the substrate 230. Thus, the red interface layer 255R, the red resonance auxiliary layer 256R, and the red organic emission layer 257R are sequentially formed on the red host layer 254R of the substrate 230.

As described, in the laser induced thermal imaging process, the red interface layer 255R is formed on the red resonance auxiliary layer 256R of the donor film and transferred onto the red host layer 254R such that thermal damage to the red resonance auxiliary layer 256R and the red host layer 254R caused by thermal energy can be minimized and such that the interface characteristics such as carrier transmission rate at the interface between the red resonance auxiliary layer 256R and the red host layer 254R can be improved. Further, since the thermal damage to the red resonance auxiliary layer 256R and the red host layer 254R can be minimized, an abnormal increase in a driving voltage of the red pixel can be substantially prevented, thereby improving product reliability.

Next, the green organic emission layer 257G is formed through the above-stated process. That is, a donor film including the green organic emission layer 257G is transferred onto the green host layer 254G of the substrate 230 where the pixel electrode 240 is formed so as to form the green interface layer 255G, the green resonance auxiliary layer 256G, and the green organic emission layer 257G on the green host layer 254G of the green pixel G.

Meanwhile, the red and green host layers 254R and 254G are respectively made of a material formed by mixing a red or green host and dopant at a constant ratio.

In the typical structure where a blue organic emission layer is formed in lower portions of red and green interface layers of red and green pixels R and G, the level of highest occupied molecular orbital (HOMO) energy of the blue organic emission layer is relatively higher than those of the red and green interface layers, and thus, the blue organic emission layer acts as a high energy barrier in hole injection to the red and green interface layers from a hole auxiliary layer. Accordingly, hole injection is not smoothly performed from the hole auxiliary layer thereby causing an increase in a driving voltage for the movement of carriers.

Thus, red and green host layers 254R and 254G included in red and green pixels can be formed instead of the blue organic emission layer included in the typical BBCL structure. This configuration reduces the difference between energy levels of the blue organic emission layer and the red and green host layers, and accordingly, the energy barrier is reduced and hole injection can be smoothly performed. Accordingly, an increase of the driving voltage of the pixels can be prevented, thereby improving the luminous efficiency and improving the life-span of the OLED display.

An electron auxiliary layer 258 is wholly on each of the red, green, and blue organic emission layers 257R, 257G, and 252 and the electron auxiliary layer 258 includes an electron transport layer (ETL) and an electron injection layer (EIL) layered on the ETL.

The hole auxiliary layer 251 and the electron auxiliary layer 258 are provided for the improvement of luminous efficiency of each of the organic emission layers 257R, 257G, and 252. The hole transport layer of the hole auxiliary layer 251 and the electron transport layer of the electron auxiliary layer 258 are provided for balancing electrons and holes and the hole injection layer of the hole auxiliary layer 251 and the electron injection layer of the electron auxiliary layer 258 are provided for the enhancement of injection of the electrons and the holes.

A common electrode 360 applying a common voltage is formed on the electron auxiliary layer 258. The common electrode 360 may be double-layered with a lower layer and an upper layer and may have a transflective characteristic so that light may be partially reflected and partially transmitted. The lower layer and the upper layer are formed of metals having a light reflection characteristic, but may have characteristics of reflecting or transmitting incident light when the thickness of each layer is decreased. Alternatively, the common electrode 360 may be formed of a single layer.

A capping layer (CPL) 270 may be formed on the common electrode 360 and an encapsulation layer (not shown) may be further formed on the capping layer 270. The capping layer 270 may protect the common electrode 260 by being formed over the entire common electrode 360. The encapsulation layer may protect the OLED by preventing permeation of moisture or oxygen from the environment.

The OLED display according to the present embodiment displays an image by emitting light toward the common electrode 360. When the light emitted toward the common electrode 360 from the organic emission layers 257R, 257G, and 252 reaches the common electrode 360, the light is partially transmitted through the common electrode 360 and partially reflected toward the pixel electrode 240. Then, the pixel electrode 240 reflects the light back to the common electrode 360. Interference occurs in the light confined between the pixel electrode 240 and the common electrode 360 and light having a wavelength corresponding to the distance between the pixel electrode 240 and the common electrode 360 may resonate. The intensity of the resonating light may be stronger due to the constructive interference while light of other wavelengths become weaker due to destructive interference. The reflection and interference process of the light is called a microcavity effect.

The above-described embodiment relates to a top emission structure in which the pixel electrode 240 includes a reflective layer and the common electrode 360 has a transflective characteristic so that light is emitted through the common electrode 360. However, in other embodiments the OLED display has a bottom emission structure in which the reflective layer of the pixel layer 240 is replaced with a transflective layer and the thickness of the common electrode 360 is increased to reflect light which is then discharged through the substrate 230.

Figure 5:
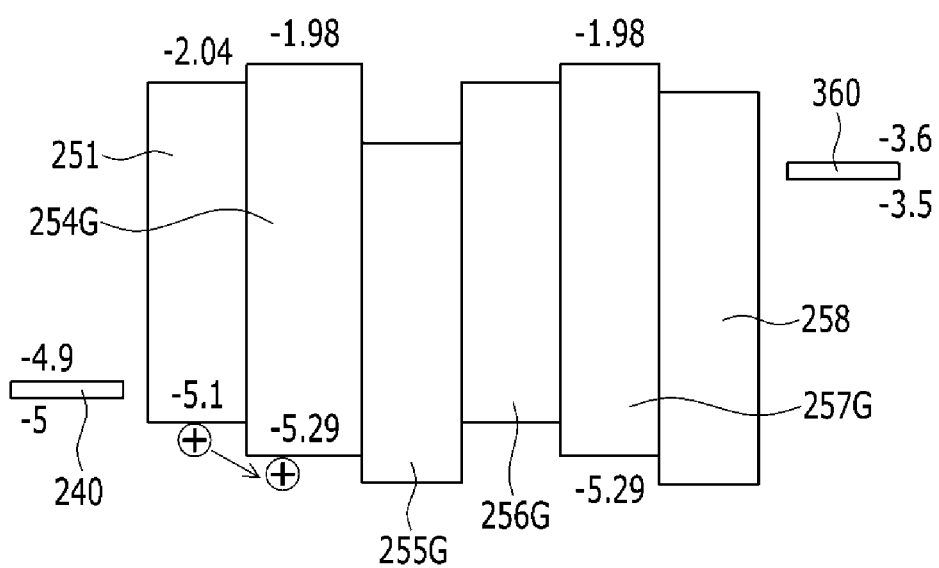
FIG. 5 shows an energy level diagram of a green pixel of the OLED display according to an exemplary embodiment.

FIG. 5 shows an energy level diagram of the green pixel of the OLED display according to an exemplary embodiment.

Figure 6:
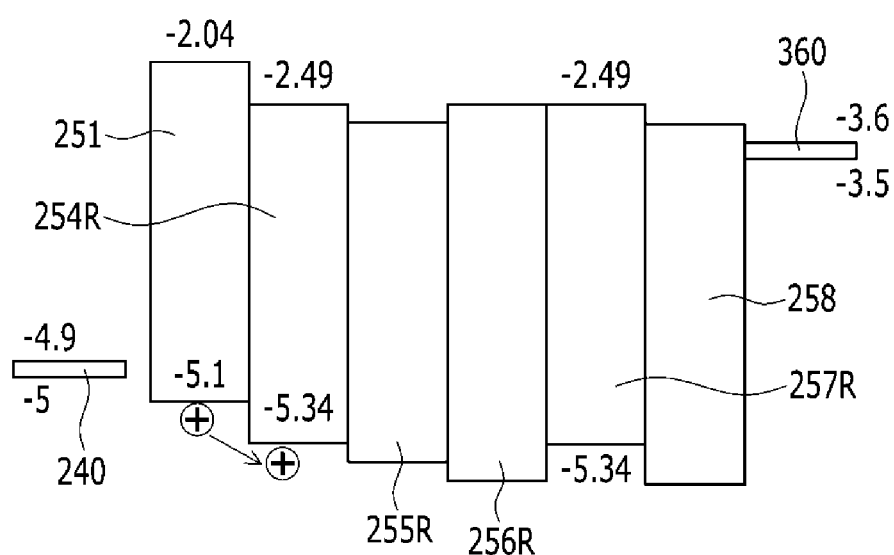
FIG. 6 shows an energy level diagram of a red pixel of the OLED display according to an exemplary embodiment.

FIG. 6 shows an energy level diagram of the red pixel of the OLED display according to an exemplary embodiment.

Referring to FIG. 5, the blue host layer of the green pixel G of a typical BBCL structure is replaced with the green host layer 254G and the holes are injected to the green host layer 254G from the hole auxiliary layer 251. The hole auxiliary layer 251 has a HOMO energy level of about −5.1 eV and the green host layer 254G has a HOMO energy level of about −5.29 eV. The HOMO refers to the highest orbital filled with electrons in a molecule orbital diagram. The difference between the HOMO energy levels of the hole auxiliary layer 251 and the green host layer 254G, that is, about 0.19 eV, acts as an energy barrier for hole injection. In a typical structure, the blue host layer has a HOMO energy level of about −5.61 eV and thus the energy barrier becomes about 0.5 eV in hole injection. However, according to at least one embodiment, the energy barrier is 0.19 eV and the energy barrier can be significantly reduced by replacing the blue host layer with the green host layer 254G.

Referring to FIG. 6, since the red host layer 254R is provided in the location of the blue host layer of the red pixel R in the typical BBCL structure, the HOMO energy level of the red host layer 254R is about −5.34 eV in the present embodiment. Therefore the difference between the HOMO energy level of the hole auxiliary layer 251, which is about −5.1 eV, and the red host layer 254R, that is, about 0.24 eV, becomes an energy barrier for hole injection. The energy barrier is significantly lower than the energy barrier, which is 0.5 eV, for hole injection in the typical structure in which the blue host layer is provided in the red pixel R. As shown in FIG. 5 and FIG. 6, the energy barrier in hole injection between the hole auxiliary layer 251, the green and red host layers 254G and 254R is significantly reduced, thereby simplifying hole injection and reducing a driving voltage.

Figure 7:
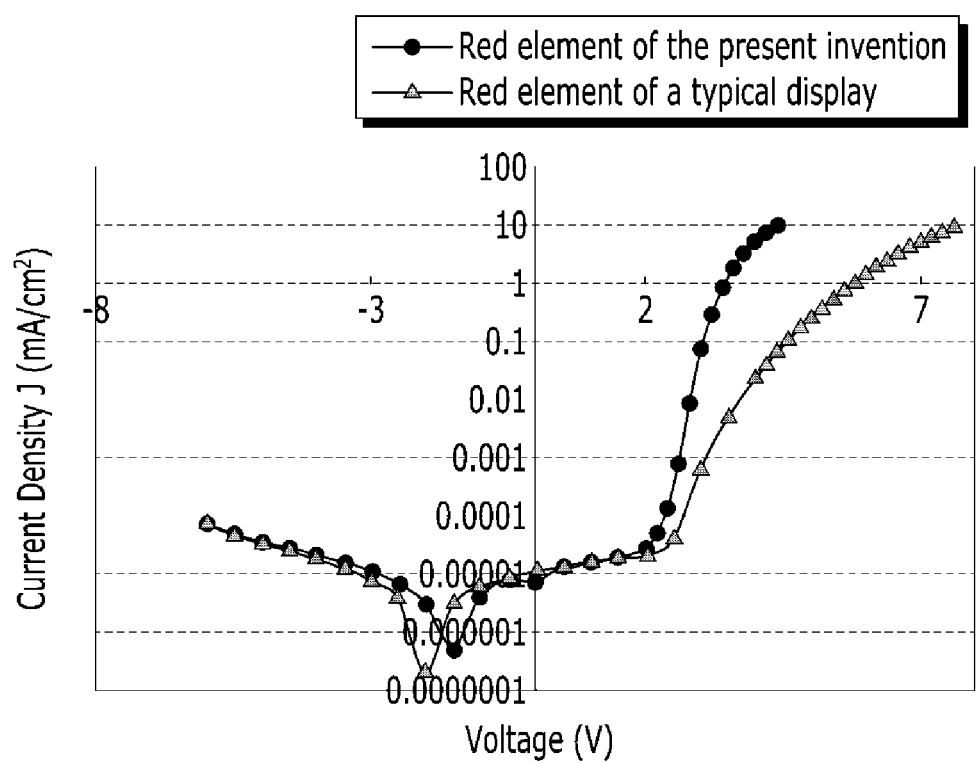
FIG. 7 is a graph comparing the driving voltage of a red element including a red pixel of the OLED display according to an exemplary embodiment and the driving voltage of a red element of a typical OLED display.

FIG. 7 is a graph comparing the driving voltage of a red element including a red pixel of the OLED display according to the present embodiment and the driving voltage of a red element of a typical OLED display (net necessarily prior art). Referring to FIG. 7, a driving voltage applied to a red element of the OLED display of the present embodiment to acquire a predetermined current density (i.e., a predetermined current flowing per unit area in a cross-section of a conductor) is lower than the driving voltage applied to a red element of the typical OLED display. That is, the red element of the typical OLED display requires about 7.4 V and the red element of the OLED display according to the present embodiment requires about 4.2 V for a current density of about 10 mA/cm².

This a result shows that, in the red pixel R of the present embodiment, the red host layer 254R reduces the energy barrier for hole injection to the red host layer 254R from the hole auxiliary layer 251. Accordingly, the red element of the present embodiment can be driven with the same current density of the typical OLED display with a lower voltage than that of the typical OLED display including the blue host layer adjacent to the red element. In the present embodiment, similar to the red element, the green host layer 254G is provided in place of the blue host layer so that the green element can be driven with the same current density at a lower voltage.

As described above, according to at least one embodiment, the red and green host layers, respectively formed of a material having a low HOMO energy level, are respectively provided in place of the blue host layers in the red and green pixels, and thus, the energy barrier for hole injection can be reduced so that the device can be driven with a low voltage. Accordingly, the luminance efficiency and life-span of the device can be improved.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
a plurality of red, green, and blue pixels,
wherein each pixel comprises:
a pixel electrode;
a hole auxiliary layer disposed over the pixel electrode;
an organic emission layer disposed over the hole auxiliary layer, wherein the hole auxiliary layer is configured to inject hole charge carriers received from the pixel electrode into the organic emission layer;
an electron auxiliary layer disposed over the organic emission layer; and
a common electrode disposed over the electron auxiliary layer, wherein the electron auxiliary layer is configured to inject electron charge carriers received from the common electrode into the organic emission layer, and
wherein each of the red and green pixels further comprises:
a host layer disposed between the hole auxiliary layer and the organic emission layer; and
a resonance auxiliary layer disposed between the host layer and the organic emission layer,
wherein the thickness of the resonance auxiliary layers included in each of the red and green pixels is selected such that light having a wavelength corresponding to the color of the pixel resonates between the pixel electrode and the common electrode, and
wherein the organic emission layer of each of the blue pixels is disposed directly over the hole auxiliary layer.

2. The OLED display of claim 1, wherein each of the red and green pixels further comprises an interface layer disposed between the host layer and the resonance auxiliary layer.

3. The OLED display of claim 1, wherein the hole auxiliary layer comprises i) a hole injection layer disposed over the pixel electrode and ii) a hole transport layer disposed over the hole injection layer and wherein the electron auxiliary layer comprises i) an electron transport layer disposed over each of the organic emission layers and ii) an electron injection layer disposed over the electron transport layer.

4. The OLED display of claim 1, wherein the host layer included in the red pixel comprises a red host layer formed at least partially of a red organic emission material.

5. The OLED display of claim 4, wherein the red organic emission material has the highest occupied molecular orbital (HOMO) energy level of about −5.34 eV.

6. The OLED display of claim 1, wherein the host layer included in the green pixel is a green host layer formed at least partially of a green organic emission material.

7. The OLED display of claim 6, wherein the green organic emission material has the highest occupied molecular orbital (HOMO) energy level of about −5.29 eV.

8. The OLED display of claim 1, wherein the organic emission layer included in the blue pixel is formed at least partially of a blue organic emission material.

9. The OLED display of claim 8, wherein the blue organic emission material has the highest occupied molecular orbital (HOMO) energy level of about −5.61 eV.

10. The OLED display of claim 2, wherein at least two of the host layer, the interface layer, the resonance auxiliary layer, or the organic emission layer are substantially aligned with each other.

11. The OLED display of claim 2, wherein at least two of the host layer, the interface layer, the resonance auxiliary layer, or the organic emission layer have substantially the same width.

12. The OLED display of claim 2, wherein at least one of the host layer, the interface layer, the resonance auxiliary layer, or the organic emission layer is disposed directly above the pixel electrode.

13. An organic light-emitting diode (OLED) display, comprising:
 a substrate;
 a hole auxiliary layer disposed over the substrate;
 an electron auxiliary layer disposed over the hole auxiliary layer; and
 a plurality of red, green, and blue pixels disposed over the substrate,
 wherein each pixel comprises an organic emission layer disposed between the hole auxiliary layer and the electron auxiliary layer,
 wherein the hole auxiliary layer is configured to infect hole charge carriers received from each of the pixel electrodes into the corresponding organic emission layer,
 wherein the electron auxiliary layer is configured to inject electron charge carriers received from the common electrode into each of the organic emission layers,
 wherein each of the red and green pixels comprises:
  a host layer disposed between the hole auxiliary layer and the organic emission layer; and
  a resonance auxiliary layer disposed between the host layer and organic emission layer,
 wherein the thickness of the resonance auxiliary layers included in each of the red and green pixels is selected such that light having a wavelength corresponding to the color of the pixel resonates between the pixel electrode and the common electrode, and
 wherein the organic emission layer of each of the blue pixels is disposed directly over the hole auxiliary layer.

14. The OLED display of claim 13, wherein each of the red and green pixels further comprises an interface layer disposed between the host layer and the resonance auxiliary layer.

15. The OLED display of claim 13, further comprising a common electrode disposed over the electron auxiliary layer, wherein each pixel further comprises a pixel electrode disposed between the substrate and the hole auxiliary layer.

16. The OLED display of claim 15, wherein the hole auxiliary layer comprises i) a hole injection layer disposed over the pixel electrode and ii) a hole transport layer disposed over the hole injection layer and wherein the electron auxiliary layer comprises i) an electron transport layer disposed over each of the organic emission layers and ii) an electron injection layer disposed over the electron transport layer.

17. The OLED display of claim 14, wherein at least two of the host layer, the interface layer, the resonance auxiliary layer, or the organic emission layer are substantially aligned with each other.

18. The OLED display of claim 14, wherein at least one of the host layer, the interface layer, the resonance auxiliary layer, or the organic emission layer is disposed directly above the pixel electrode.

19. The OLED display of claim 1, wherein a difference in highest occupied molecular orbital (HOMO) energy levels between the hole auxiliary layer and the organic emission layer of the blue pixel is greater than differences in HOMO energy levels between the hole auxiliary layer and the host layer for each of the red and green pixels.

20. The OLED display of claim 13, wherein a difference in highest occupied molecular orbital (HOMO) energy levels between the hole auxiliary layer and the organic emission layer of the blue pixel is greater than differences in HOMO energy levels between the hole auxiliary layer and the host layer for each of the red and green pixels.

* * * * *